(12) United States Patent
Wang et al.

(10) Patent No.: US 10,714,339 B2
(45) Date of Patent: Jul. 14, 2020

(54) SELECTIVELY DEPOSITED PARYLENE MASKS AND METHODS RELATED THERETO

(71) Applicant: Applied Materials, Inc., Santa Clara, CA (US)

(72) Inventors: Fei Wang, Fremont, CA (US); Miaojun Wang, Santa Clara, CA (US); Pramit Manna, Santa Clara, CA (US); Shishi Jiang, Santa Clara, CA (US); Abhijit Basu Mallick, Fremont, CA (US); Robert Jan Visser, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/246,776

(22) Filed: Jan. 14, 2019

(65) Prior Publication Data
US 2019/0221422 A1 Jul. 18, 2019

Related U.S. Application Data

(60) Provisional application No. 62/618,808, filed on Jan. 18, 2018.

(51) Int. Cl.
*H01L 21/027* (2006.01)
*H01L 21/02* (2006.01)
(Continued)

(52) U.S. Cl.
CPC .... *H01L 21/0271* (2013.01); *H01L 21/02118* (2013.01); *H01L 21/02271* (2013.01);
(Continued)

(58) Field of Classification Search
None
See application file for complete search history.

(56) References Cited

U.S. PATENT DOCUMENTS

| | | | |
|---|---|---|---|
| 8,119,322 B2* | 2/2012 | Brunner | G03F 7/0035 430/270.1 |
| 8,945,305 B2* | 2/2015 | Marsh | C23C 16/0227 117/103 |

(Continued)

OTHER PUBLICATIONS

Herregods, Sebastiaan J.F. et al.—"Vapour phase self-assembled monolayers for ALD blocking on 300 mm wafer scale" conference paper, Jun. 2017, downloaded from ResearchGate website, 3 pages.

(Continued)

*Primary Examiner* — Ali Naraghi
(74) *Attorney, Agent, or Firm* — Patterson + Sheridan LLP

(57) ABSTRACT

Methods of selectively depositing a mask layer on a surface of a patterned substrate and self-aligned patterned masks are provided herein. In one embodiment, a method of selectivity depositing a mask layer includes positioning the patterned substrate on a substrate support in a processing volume of a processing chamber, exposing the surface of the patterned substrate to a parylene monomer gas, forming a first layer on the patterned substrate, wherein the first layer comprises a patterned parylene layer, and depositing a second layer on the first layer. In another embodiment, a self-aligned patterned mask comprises a parylene layer comprising a plurality of parylene features and a plurality of openings, the parylene layer is disposed on a patterned substrate comprising a dielectric layer and a plurality of metal features, the plurality of metal feature comprise a parylene deposition inhibitor metal, and the plurality of parylene features are selectivity formed on dielectric surfaces of the dielectric layer.

20 Claims, 7 Drawing Sheets

(51) Int. Cl.
   *H01L 21/3205* (2006.01)
   *H01L 21/32* (2006.01)
   *H01L 21/311* (2006.01)

(52) U.S. Cl.
   CPC ......... *H01L 21/31138* (2013.01); *H01L 21/32* (2013.01); *H01L 21/3205* (2013.01)

(56) References Cited

U.S. PATENT DOCUMENTS

| | | |
|---|---|---|
| 2010/0055422 A1 | 3/2010 | Kong et al. |
| 2010/0210098 A1* | 8/2010 | Faltermeier ......... H01L 21/0337 438/586 |

OTHER PUBLICATIONS

Cetinkaya, M., et al.—"Growth of nanostructured thin films of poly(p-xylylene) derivatives by vapor deposition," Elsevier, Polymer xx, 2007, DOI:10.1016/j.polymer.2007.05.015, pp. 1-5.

Senkevich, Jay J., et al.—"Selective Deposition of Ultrathin Poly(p-xylylene) Films on Dielectrics Versus Copper Surfaces," Chemical Vapor Deposition, No. 5, 2004, pp. 247-249.

PCT International Search Report and Written Opinion dated May 8, 2019, for International Application No. PCT/US2019/013317.

* cited by examiner

SELECTIVELY DEPOSITED PARYLENE MASKS AND METHODS RELATED THERETO

CROSS-REFERENCE TO RELATED APPLICATIONS

This application claims priority to U.S. Provisional Application Ser. No. 62/618,808 filed on Jan. 18, 2018, which is herein incorporated by reference in its entirety.

BACKGROUND

Field

Embodiments described herein generally relate to the field of semiconductor device manufacturing, in particular, embodiments herein relate to patterned parylene mask layers, and methods of forming the patterned parylene mask layers.

Description of the Related Art

Reliably producing sub-half micron and smaller features is one of the key technology challenges for the next generation of very large scale integration (VLSI) and ultra large scale integration (ULSI) of semiconductor devices. As the limits of circuit technology are pushed, the shrinking dimensions of VLSI and ULSI technology have placed additional demands on processing capabilities.

As circuit densities increase for next generation devices, the widths of interconnects, such as vias, trenches, contacts, gate structures and other features, decrease to 22 nm or smaller dimensions. The dimensions of the dielectric materials disposed between the features likewise shrink and edge placement errors (EPE) associated with conventional lithography methods become increasingly problematic. Conventional lithography methods generally include depositing a mask layer on a to be patterned surface of a substrate, forming a plurality of openings in the mask layer to form a patterned mask layer, and forming a patterned surface on the substrate by removing material from, or depositing material on, the surface of the substrate through the openings in the patterned mask layer. Semiconductor devices typically comprise a plurality of patterned material layers where each patterned material layer has a plurality of features formed therein or thereon and where each layer is formed using a plurality of lithography steps. Edge placement errors occur when the actual location of openings formed in the mask, and therefore features formed therethrough, are different from the intended locations thereby causing a misalignment between features formed in multiple layers. Unfortunately, as circuit densities increase and feature sizes shrink, the shrinking tolerances for edge placement errors are pushing the limits of conventional lithography processes.

Accordingly, there is a need in the art for patterned masks, and methods of forming patterned masks, that eliminate and, or, substantially reduce error in feature alignment during the formation of multi-layer semiconductor devices.

SUMMARY

The present disclosure generally provides self-aligned patterned parylene mask layers, and methods of forming the patterned parylene mask layers.

In some embodiments, which may be combined with one or more other embodiments described herein, a method of selectivity depositing a mask layer on a patterned surface of a substrate includes positioning the substrate on a substrate support in a processing volume of a processing chamber, wherein the patterned surface of the substrate comprises a dielectric layer and a plurality of first metal features disposed in the dielectric layer, exposing the patterned surface to a parylene monomer gas, selectively depositing a first layer comprising parylene onto surfaces of the dielectric layer, and depositing a second layer onto the plurality of first metal features.

In some embodiments, which may be combined with one or more other embodiments described herein, a method of selectivity depositing a mask layer on a patterned surface of a substrate includes positioning the patterned substrate on a substrate support in a processing volume of a processing chamber; wherein the surface of the patterned substrate includes a dielectric layer and a plurality of first metal features disposed in the dielectric layer, wherein the plurality of first metal features comprise a parylene deposition inhibitor metal selected from the group consisting of Ta, Fe, Ru, W, Co, Ni, Pd, Pt, Cu, Ag, Au, Mo, and combinations thereof, flowing a parylene monomer gas into the processing volume while rotating the patterned substrate disposed therein, exposing the surface of the patterned substrate to the parylene monomer gas, forming a first layer on the patterned substrate, wherein the first layer comprises a patterned parylene layer, and wherein forming the patterned parylene layer comprises selectively depositing a plurality of parylene features on dielectric surfaces of the dielectric layer, and depositing a second layer on the first layer.

In some embodiments, which may be combined with one or more other embodiments described herein, a self-aligned patterned mask features a parylene layer deposited directly onto a surface of a patterned substrate, wherein the parylene layer comprises a plurality of parylene features and a plurality of openings, wherein the patterned substrate comprises a dielectric layer and a plurality of metal features, wherein the plurality of metal features comprises a parylene deposition inhibitor metal, and wherein the plurality of parylene features are selectivity formed directly on dielectric surfaces of the dielectric layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to the field of semiconductor device manufacturing, in particular, embodiments herein relate to patterned parylene mask layers which may be used in the manufacturing of semiconductor devices, and methods of forming the patterned parylene mask layers.

Figure 1:
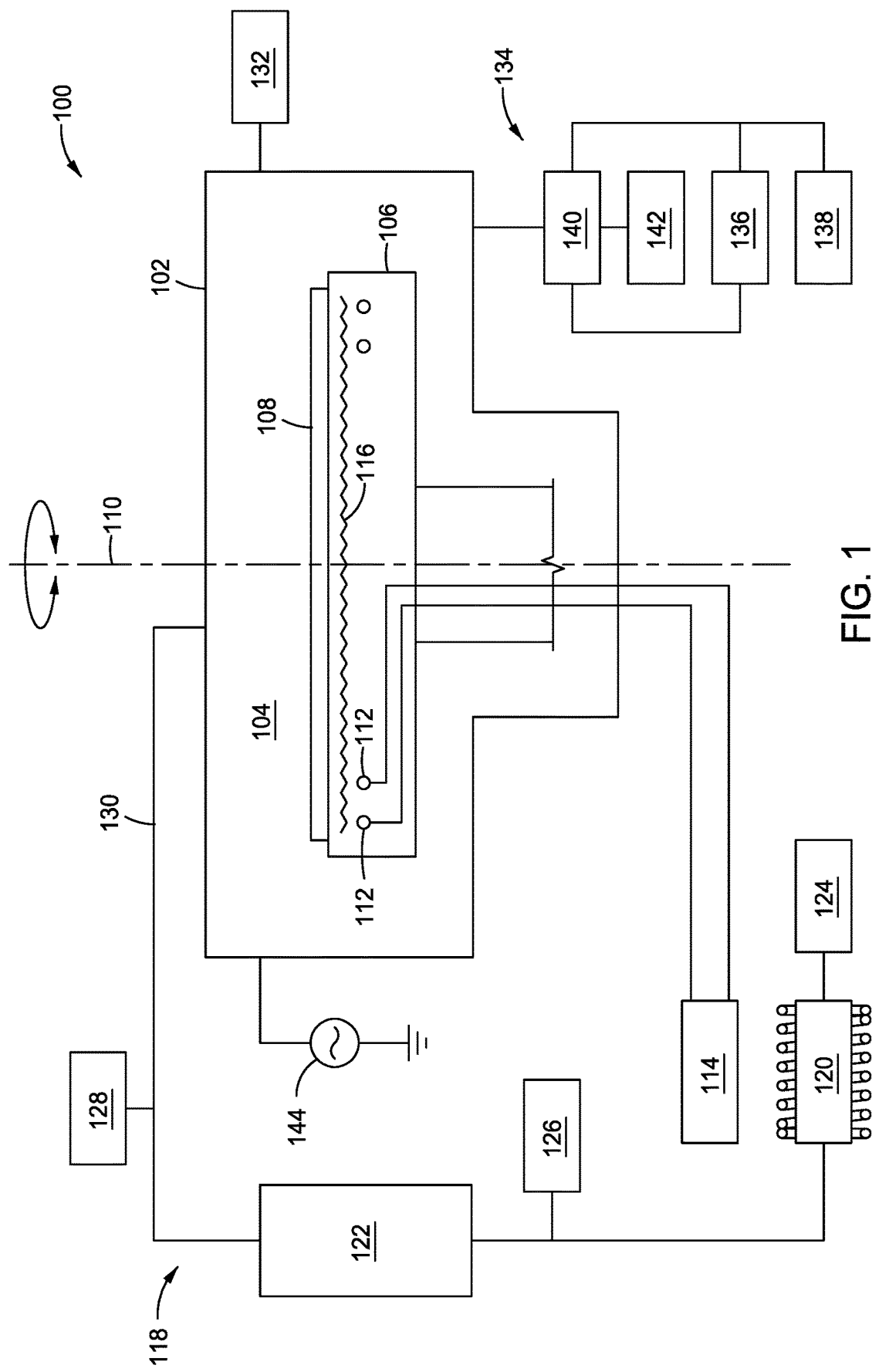
FIG. 1 is a schematic view of an example processing chamber used to practice the methods described herein, according to some embodiments.

FIG. 1 is a schematic view of an example processing system used to practice the methods described herein, according to one or more embodiments. The processing chamber 100 includes a chamber body 102 defining a processing volume 104. A substrate support 106, disposed within the chamber body 102, is configured to support a substrate 108 and rotate the substrate 108 about an axis 110 during processing thereof. Herein, the substrate support 106 includes one or more cooling channels 112 disposed therein that are fluidly coupled to, and in fluid communication with, a first coolant source 114, such as a refrigerant source or a water source having relatively high electrical resistance. In some embodiments, the substrate support further includes a heater, such as a resistive heating element 116, embedded in the material thereof.

Herein, a precursor gas is provided to the processing volume 104 using a precursor source 118 in fluid communication therewith. The precursor source 118 includes a vaporizer 120 and a decomposition chamber 122 fluidly coupled thereto. The vaporizer 120 is used vaporize and, or, sublimate a solid-phase precursor, herein a parylene dimer, such as a parylene N dimer, a parylene D dimer, a parylene C dimer, a parylene HT dimer, or a combination thereof, to a vapor-phase using a thermal and, or, vacuum enhanced vaporization process. Typically, the vaporizer 120 is maintained at a temperature between about 70° C. and about 200° C. and a pressure of between about 1 mTorr and about 1 Torr during the deposition processes described herein. In some embodiments, the vaporizer 120 is fluidly coupled to a first gas source 124 which provides a first carrier gas, such as $N_2$, thereinto at a flowrate between about 0.5 sccm and about 1000 sccm, such as between about 0.5 sccm and about 100 sccm. In some embodiments, a second carrier gas, such as Ar or $N_2$, provided by a second gas source 126, is introduced to the effluent of the vaporizer 120 to mix with the vapor-phase precursor and the first carrier gas before the resulting vapor-phase precursor and carrier gas mixture flows into the decomposition chamber 122. The decomposition chamber 122 heats the vapor-phase precursor and carrier gas mixture to a temperature between about 550° C. and about 700° C. to yield a precursor gas comprising stable parylene monomer diradicals, such as para-xylylene, through a thermal decomposition (pyrolysis) reaction. The precursor gas flows from the decomposition chamber 122 into the processing volume 104 of the chamber body 102 where a patterned surface of a substrate 108 is exposed thereto and a polymerized parylene layer is deposited thereon. In some embodiments, a vapor-phase co-monomer, provided by a co-monomer source 128, is mixed with the precursor gas in a delivery line 130 fluidly coupling the decomposition chamber 122 to the processing volume 104.

In some embodiments, the substrate is at room temperature, such as between about 20° C. and about 30° C., for example about 25° C. during the deposition of the parylene layer. In some embodiments, the substrate support 106 is configured to maintain the substrate 108 at a desired temperature between about −10° C. and about 150° C., such as between about 0° C. and about 50° C., for example between about 20° C. and about 30° C. Herein, a heater 132 thermally coupled to the chamber body 102 is configured to maintain the chamber body 102 at a desired temperature to substantially reduce undesired parylene deposition on the interior surfaces thereof.

The processing chamber 100 further includes an exhaust assembly 134 fluidly coupled to the processing volume 104 for maintaining the processing volume 104, and the decomposition chamber 122 and vaporizer 120 in fluid communication therewith, at sub-atmospheric pressure. The exhaust assembly 134 is further used to evacuate unreacted parylene monomers and, or, other gases from the processing volume 104. Herein, the exhaust assembly 134 includes one or more dedicated vacuum pumps, such as a turbo pump 136 and a rough pump 138, and a cold trap 140 disposed between the processing volume 104 and the one or more dedicated vacuum pumps. Herein, the cold trap 140 is thermally coupled to a second coolant source 142, such as a liquid $N_2$ source, and is used to prevent unreacted precursor gases, such as unreacted parylene monomer gases, from reaching the one or more dedicated vacuum pumps 136, 138 and undesirably depositing parylene on surfaces therein. Herein, the processing volume 104 is a pressure of less than about 1 Torr, such as less than about 0.5 Torr, for example less than about 0.1 Torr, such as about 0.5 Torr.

In some embodiments, the chamber body 102, such as a chamber lid of the chamber body 102, is coupled to a power source, such as RF power source 144, which is used to ignite and maintain a plasma of one or more precursor gases, or mixtures thereof, through capacitively coupling energy therewith.

Figure 2:
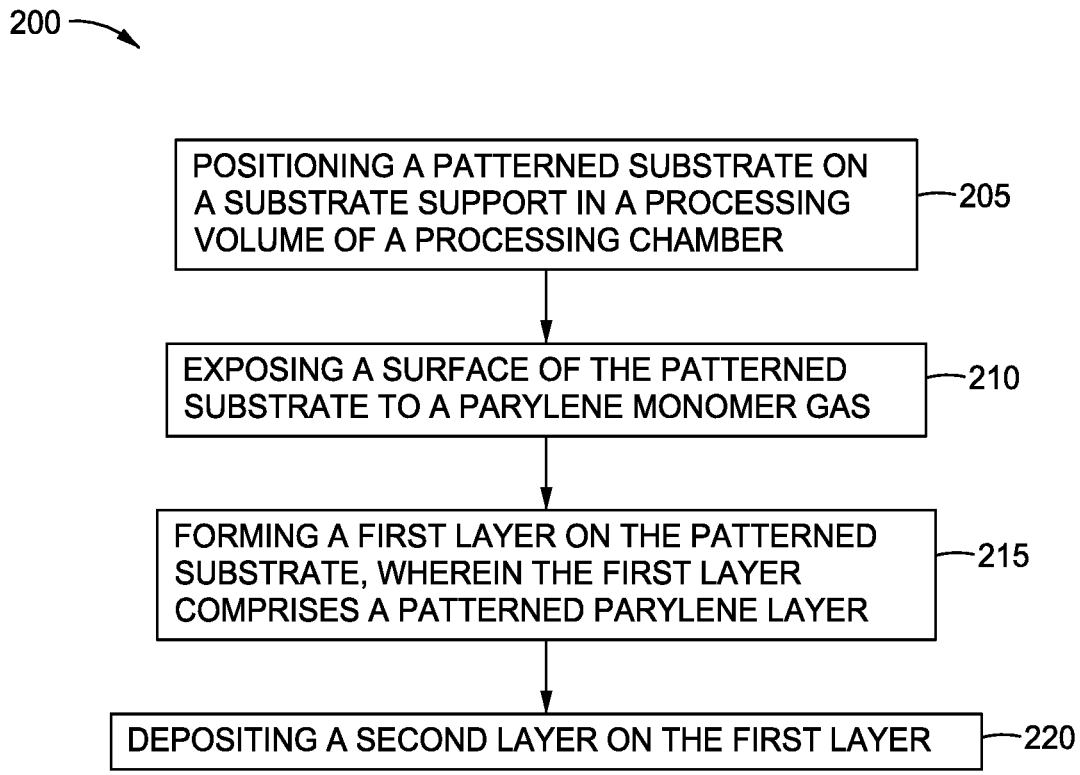
FIG. 2 is a flow diagram of a method of selectivity depositing a mask layer on a surface of a patterned substrate, according to some embodiments.

FIG. 2 is a flow diagram of a method of selectivity depositing a parylene mask layer on a surface of a patterned substrate, according to one embodiment. FIGS. 3A-3D, 4A-4B, and 5A-5B illustrate the method 200 set forth in FIG. 2. At activity 205 the method 200 includes positioning the patterned substrate, such as the patterned substrate 300 shown in FIGS. 3A-3D, 4A-4B, and 5A-5B, on a substrate support in a processing volume of a processing chamber, such as the processing chamber 100 described in FIG. 1. The patterned substrate 300 includes a substrate 301, such as a silicon substrate or a substrate formed of any other suitable material, a dielectric layer 303 disposed on the substrate 301, and a plurality of first metal features 305 disposed in the dielectric layer 303.

In embodiments herein, the plurality of first metal features 305 comprise a metal that inhibits the polymerization of, and therefore the deposition of, a desired parylene layer thereon (hereafter parylene deposition inhibitor metals). Typical parylene deposition inhibitor metals include Ta, Fe, Ru, W, Co, Ni, Pd, Pt, Mo, Cu, Ag, Au, or combinations thereof. In some embodiments, the dielectric layer 303 is formed of a material comprising Si, $SiO_2$, $SiN_xO_y$, SiN, SiOC, SiC, Si low-k polymers, such as a polyamide, high-k dielectric materials, or combinations thereof. High-K dielectric materials herein include aluminum-(Al), hafnium-(Hf), lanthanum-(La), or zirconium-(Zr) based oxides, oxynitrides, and, or, silicon nitrides ($Si_xN_y$), in single or layered structures (e.g., a $SiO_2$/high-k/$SiO_2$). In some embodiments, a width W of one or more of the plurality of first metal features 305 is less than about 50 nm, for example less than about 22 nm.

At activity 210 the method 200 includes exposing a surface of the patterned substrate 300 to a precursor gas comprising parylene monomers. In some embodiments, exposing the surface of the patterned substrate 300 to the precursor gas includes flowing the precursor gas into the processing volume of the processing chamber while rotating the patterned substrate 300. In some embodiments, the parylene monomer gas comprises the pyrolysis reaction product of a vapor-phase parylene dimer. Typically, the processing volume is maintained at a pressure of less than about 1 Torr, such as less than about 0.5 Torr, for example less than about 0.1 Torr, such as about 0.5 Torr, and a temperature of the patterned substrate is about room temperature, such as between about 20° C. and about 30° C., for example about 25° C.

Figure 3A:
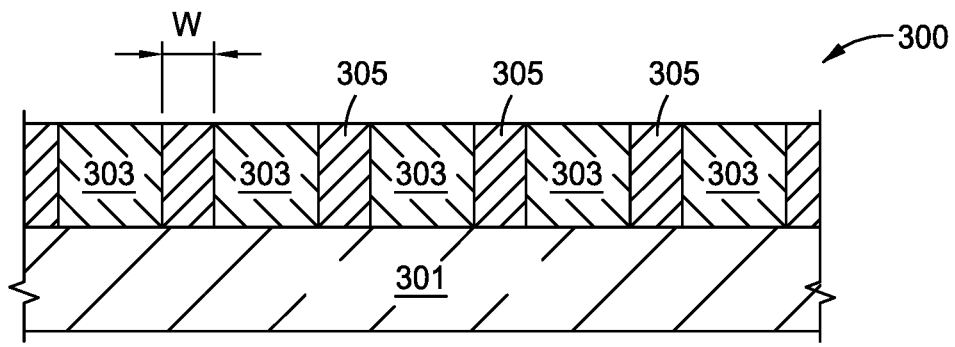
FIGS. 3A-3E schematically illustrate one or more embodiments of the methods set forth in FIG. 2.
Figure 3B:
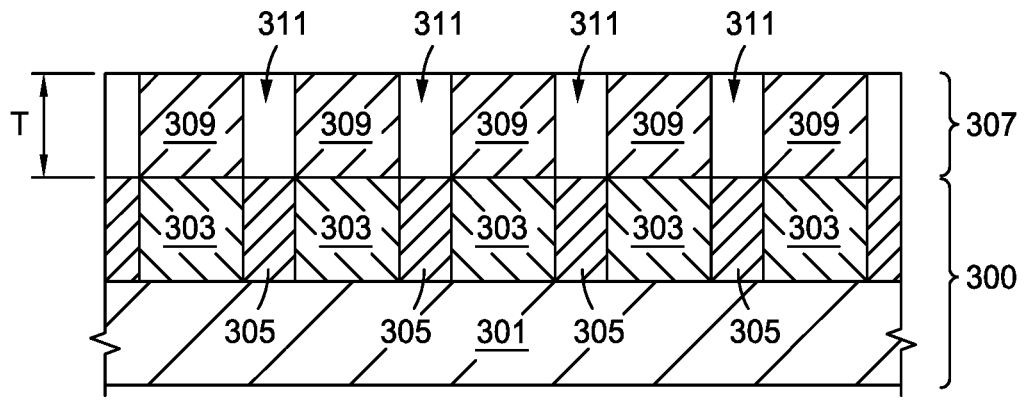
Figure 4A:
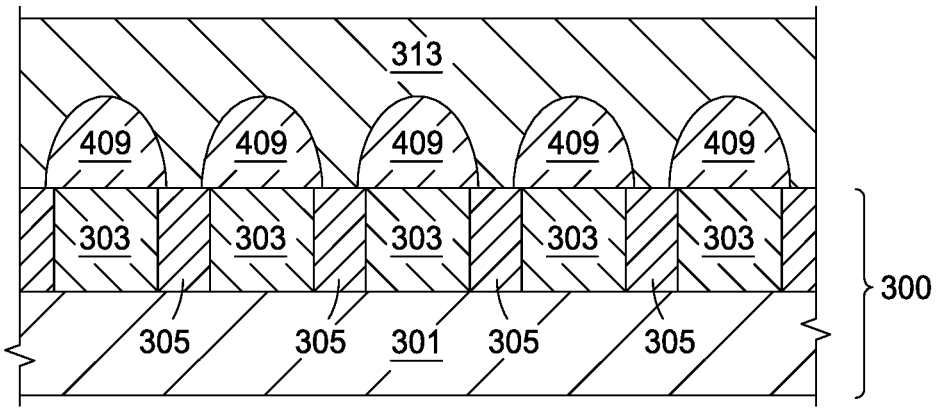
FIGS. 4A-4C schematically illustrate one or more embodiments of the methods set forth in FIG. 2.
Figure 4B:
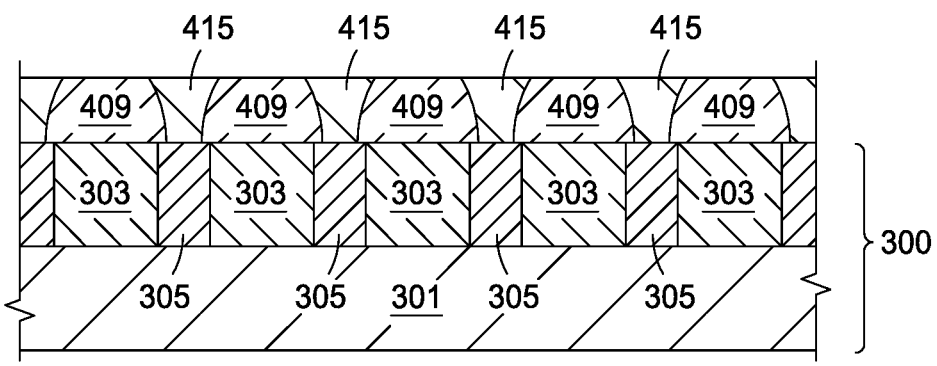
Figure 5A:
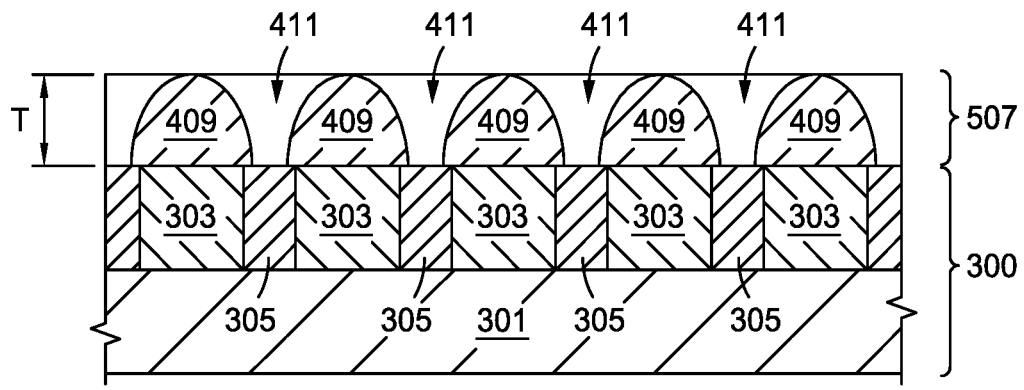
FIGS. 5A-5C schematically illustrate one or more embodiments of the method set forth in FIG. 2.

At activity 215 the method 200 includes forming a first layer on the patterned substrate 300, where the first layer comprises a patterned parylene layer, such as the patterned parylene layer 307 shown in FIG. 3B or the patterned parylene layer 507 shown in FIG. 5A. Herein, forming the patterned parylene layer 307 or 507 includes selectively depositing parylene directly onto the dielectric surfaces of the dielectric layer 303. The patterned parylene layer 307, 507 comprises the polymerized reaction product of the parylene monomer gas, such as parylene N, parylene D, parylene C, parylene HT, block copolymers and random copolymers thereof, and combinations thereof. In one embodiment, the patterned parylene layer 307, 507 comprises parylene N. Herein, the patterned parylene layer 307, 507 includes a plurality of parylene features, such as the parylene features 309 shown in FIGS. 3B-3D or the parylene features 409 shown in FIGS. 4A-4B and 5A-5B, selectively deposited on the dielectric surfaces of the dielectric layer 303 and a plurality of openings 311, 411 over the respective plurality of first metal features 305. In one embodiment, the plurality of parylene features, such as the plurality of parylene features 309, are substantially aligned with the dielectric surfaces of the dielectric layer 303, such as shown in FIG. 3B. In some embodiments, one or more surfaces of the parylene features 309, herein vertical surfaces, are substantially orthogonal to a surface of the patterned substrate 300. In other embodiments, lateral overgrowth of the parylene features due to anisotropic deposition thereof may cause at least a portion of a parylene feature, such as the parylene features 409 shown in FIGS. 4A-4B and 5A-5B, to extend over portions of the first metal features 305. In some embodiments, the patterned parylene layer 307, 507 has a thickness T of more than about 50 Å, such as more than about 75 Å, for example more than about 100 Å.

Figure 3C:
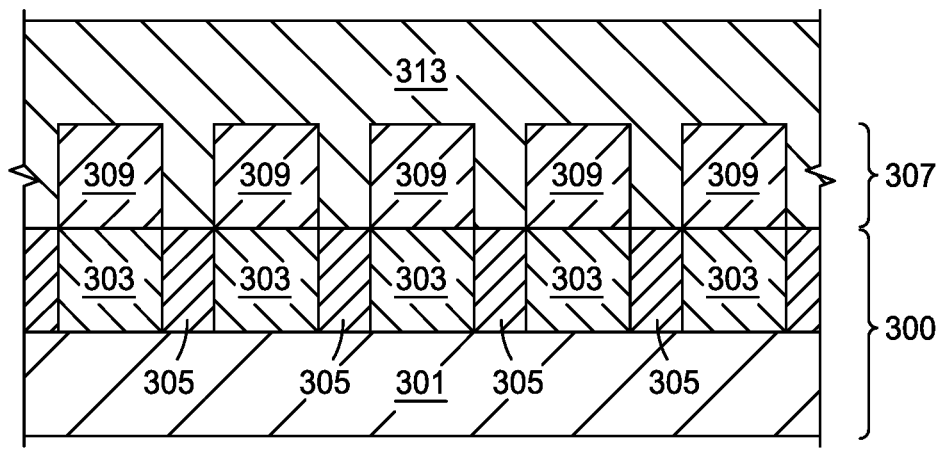

In some embodiments, the method 200 further includes activity 220 of depositing a second layer 313 over the patterned parylene layer 307, such as the second layer 313 shown in FIGS. 3C and 4A. In some embodiments, the second layer 313 comprises a metal, such as Cu, Ru, Ti, Ta, W, Al, and, or, any of the metals listed herein. In other embodiments, the second layer 313 comprises a dielectric material, such as silicon oxides, for example Si, $SiO_2$ or $SiN_xO_y$, or SiN, SiOC, SIC, Si low-k polymers, such as a polyamide, high-k dielectric materials, or combinations thereof.

Figure 3D:
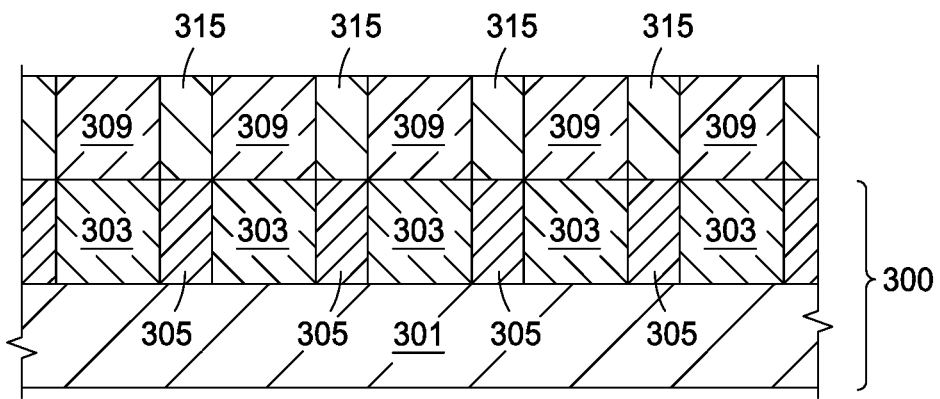

Herein, the patterned parylene layer 307 is a mask layer and the second layer 313 is deposited onto the plurality of first metal features 305 through the plurality of openings 311 to form a plurality of second features 315, such as a plurality of second metal features or a plurality of dielectric features, disposed on the plurality of first metal features. In some embodiments, such as in FIGS. 3C and 4A, the second layer 313 is also deposited on surfaces of the parylene features 309 and must be removed therefrom before a next layer material can be formed thereover. Therefore, in some embodiments, the method 200 further includes removing undesired material of the second layer, such as metal or dielectric material, from a field surface of the patterned parylene layer 307 to form a planarized surface, as shown in FIGS. 3D and 4B. In some embodiments, the undesired material is removed from the field surface of the patterned parylene layer 307 using a chemical mechanical planarization (CMP) process. In other embodiments, undesired material is removed from the field surface of the patterned parylene layer 307 using a conventional etch process. In some embodiments, the plurality of second features 315 are substantially aligned with the plurality of first metal features 305 at the interfacial surfaces thereof, such as shown in FIG. 3D. In other embodiments, a plurality of second features, such as the plurality of second features 415 shown in FIG. 4B, are substantially centered on the surfaces of the plurality of first metal features 305 disposed therebeneath.

Figure 5B:
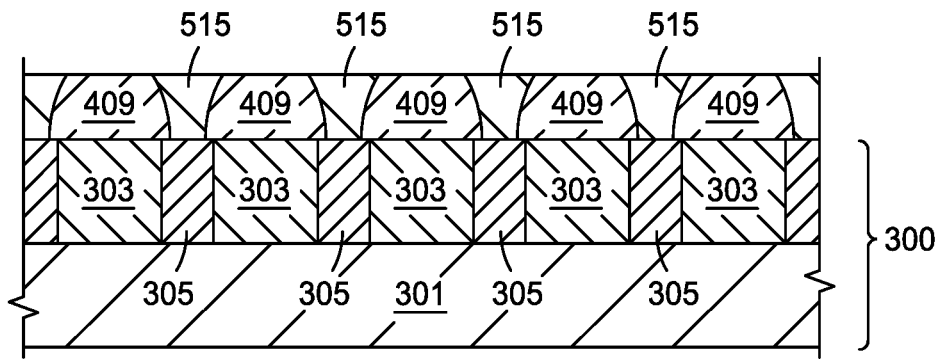

In other embodiments, a plurality of second features, such as the plurality of second features 515 shown in FIG. 5B, are formed on the respective plurality of first metal features 305 using selective atomic layer deposition (ALD) process. Typically, the selective ALD process includes sequential cyclic exposures of the patterned substrate 300 having the patterned parylene layer 307, 507 disposed thereon, herein a masked substrate, to a first precursor followed by a second precursor. First, the masked substrate is exposed to the first precursor which reacts with surfaces of the first metal features 305, or is absorbed thereunto, to form a first mono-layer. The masked substrate is then exposed to the second precursor which reacts with the first mono-layer to form a second mono-layer. Typically, the ALD sequence of exposing the masked substrate to the first precursor and the second precursor is repeated for a plurality of cycles until a desired thickness of deposited material is reached. In some embodiments, one or both of the first or second precursors do not react with and, or, are not absorbed on the surfaces of the parylene features (due to the hydrophobic surface thereof) thus enabling the selective ALD process and desirably eliminating the need to remove undesired bulk deposited material from the field surface of the patterned parylene layer 307, 507.

In some embodiments, the method 200 further includes pre-cleaning the substrate in a pre-clean chamber before depositing the parylene layer thereon. Typically, the pre-clean chamber and the chamber used to deposit the parylene mask layer are part of a multi-chamber processing system, such as the multi-chamber processing system 600 set forth in the description of FIG. 6. Here, pre-cleaning the substrate includes removing residues and, or, native oxides which may have formed on the surfaces substrate from exposure to atmospheric conditions. In some embodiments, pre-cleaning the substrate surface comprises heating the substrate, and, or exposure thereof to a remote or in-situ plasma, such as an argon plasma.

Figure 3E:
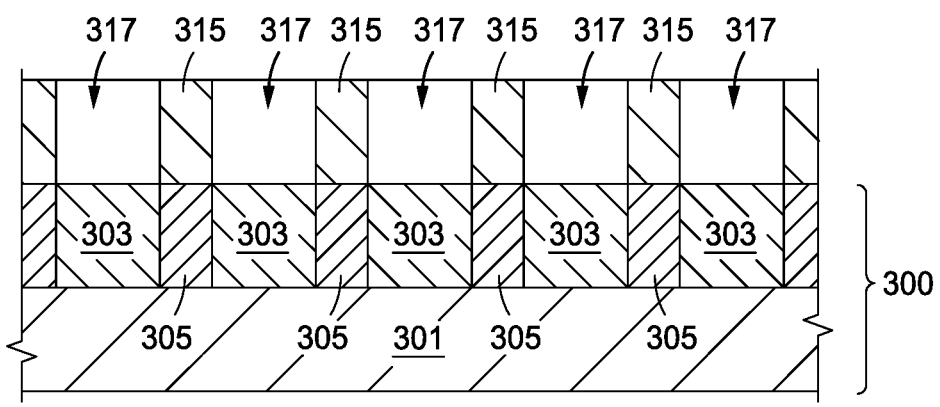
Figure 4C:
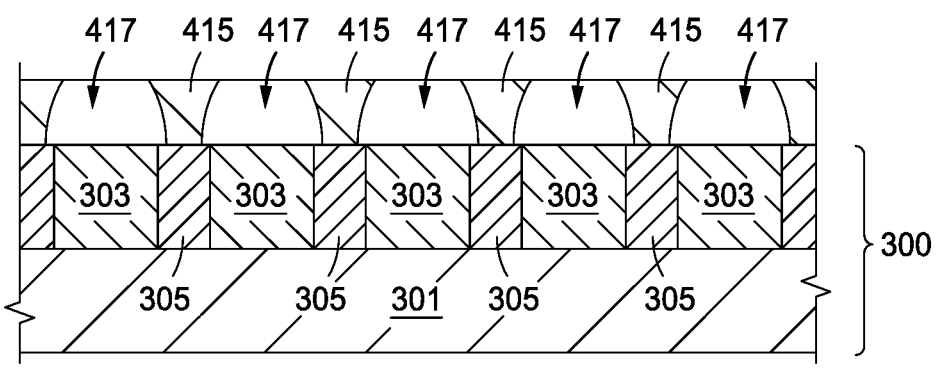
Figure 5C:
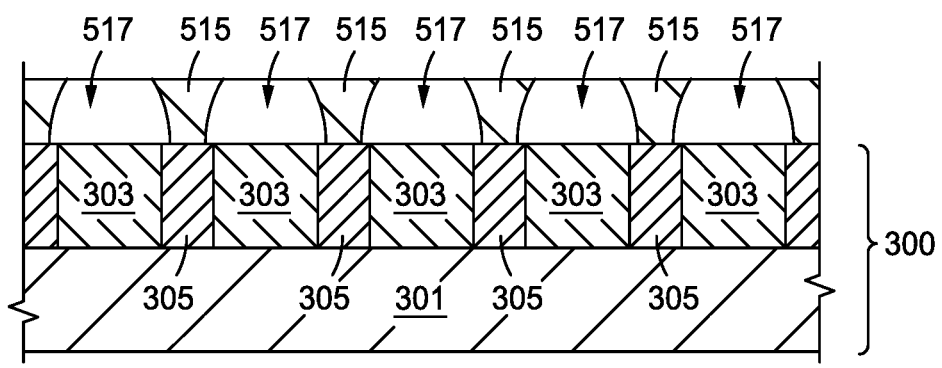

In some embodiments, the method 200 further includes removing the plurality of parylene features 309, 409, by exposure thereof to a dry plasma etch, such as an argon or oxygen based plasma etch, to form a plurality of openings 317, 417, and 517 or one or more contiguous openings, interposed between the pluralities of second features 315, 415, and 515, such as shown in FIGS. 3E, 4C, and 5C respectively. In some embodiments, removing the plurality of parylene features is done in an etch chamber which is part of the same multi-chamber processing system, such as the multi-chamber processing system 600 of FIG. 6, which is used to deposit the parylene mask.

The methods described herein allow for the formation of self-patterning selectively deposited parylene masks suitable for blocking deposition of subsequently deposited layers. The selectively deposited parylene masks may be used as a deposition blocking material in place of self-assembled monolayers (SAM), i.e., a single layer of organized organic molecules bound to a substrate surface. Typically, a SAM is formed of an organic material which exhibits an affinity for the material of the substrate surface, such as one or a combination of a silane-based SAM, such as an OTS-based SAM (formed from octadecyltrichlorosilane), a thiol-based SAM, a phosphonate based SAM, or combinations thereof. Thus, in some embodiments herein the parylene masks are selectively deposited directly onto the dielectric surfaces of the patterned substrate which does not include a self-assembled monolayer, such as a silane-based SAM, a thiol-based SAM, a phosphonate-based SAM, or a combination thereof, disposed on the dielectric surface. For example, in some embodiments, such as when the dielectric surface is formed of Si, $SiO_2$, $SiN_xO_y$, SiN, SiOC, SiC, Si low-k polymers, or high-k dielectric materials such as aluminum-(Al), hafnium-(Hf), lanthanum-(La), or zirconium-(Zr) based oxides, oxynitrides, and, or, silicon nitrides ($Si_xN_y$) the parylene mask deposited directly onto the dielectric surface.

In some embodiments, the deposition of the self-patterning parylene layers 307, 507 and the subsequent deposition of a second layer thereon, e.g., the metal or dielectric layers described above, are performed using a multi-chamber processing system (i.e., a cluster tool). The multi-chamber processing system eliminates the substrate loading and unloading operations that would be used if the deposition chambers were standalone chambers or parts of separate multi-chamber processing systems. For example a multi-chamber processing system allows for sequential processing operations without exposing the substrate to atmospheric conditions and thus reduced overall substrate processing time. An exemplary multi-chamber processing system which may be used to practice the methods set forth herein is further described in FIG. 6.

Figure 6:
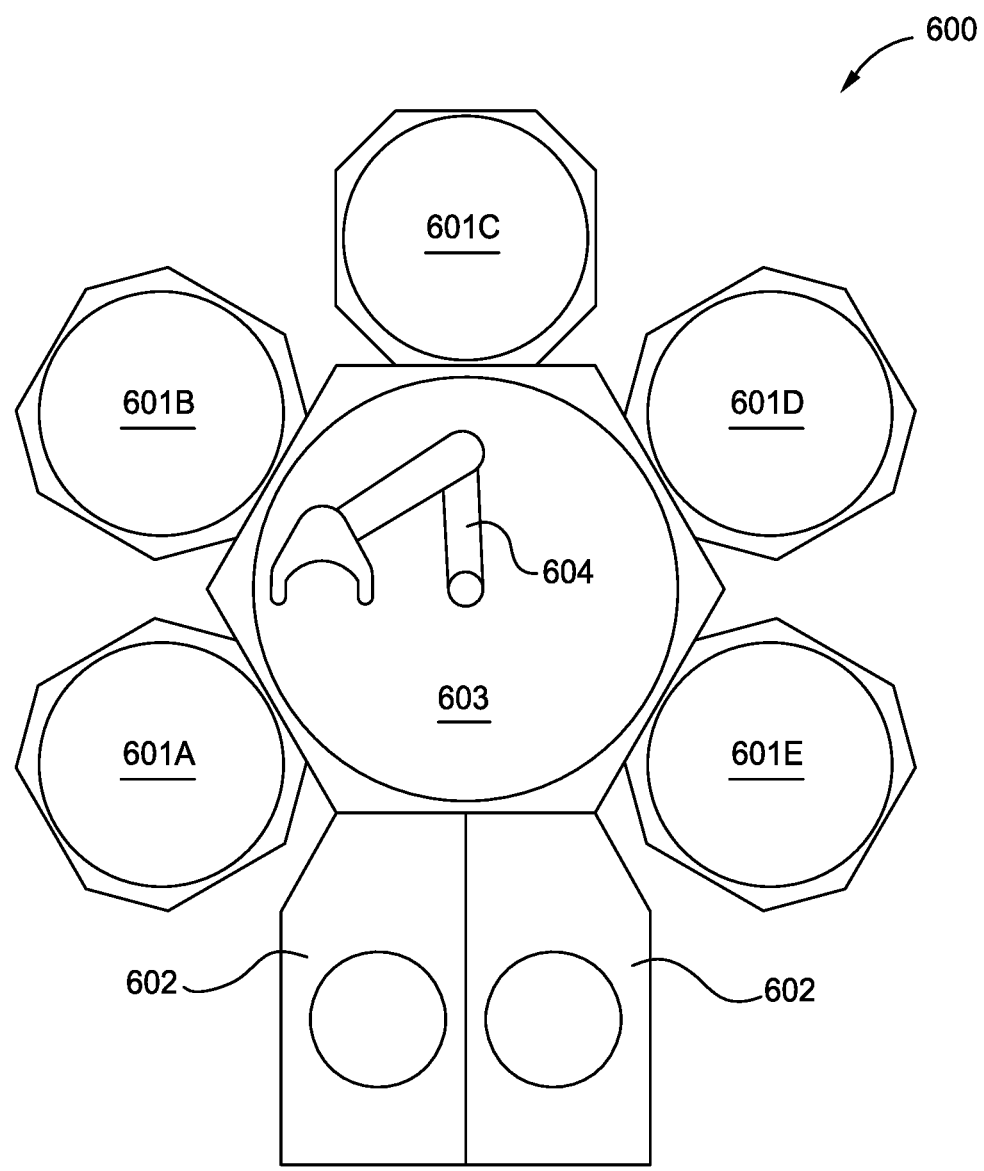
FIG. 6 is a schematic plan view of an exemplary multichamber processing system which may be used to practice the methods set forth herein, according to some embodiments.

FIG. 6 is a schematic plan view of an exemplary multi-chamber processing system which may be used to practice the methods set forth herein, according to some embodiments. Here, the multi-chamber processing system 600 includes a plurality of processing chambers 601A-E, one or more load lock chambers 602, and a transfer chamber 603 (shown with the cover removed) having a robot handler 604 disposed therein. Typically, at least one of the processing chambers 601A-E is configured to deposit parylene on a substrate surface, such as the processing chamber 100 set forth in the description of FIG. 1. In some embodiments, the processing chambers 601A-E further comprise one or a combination of a pre-clean chamber, an ALD chamber, a chemical vapor deposition (CVD) chamber, a physical vapor deposition (PVD) chamber, and a plasma etch chamber.

The methods herein provide for the formation of selectively deposited self-aligning parylene patterned masks that eliminate and, or, substantially reduce error in feature alignment during the formation of multi-layer semiconductor devices. Beneficially, the methods provided herein enable the formation of a desirably denser and thicker layer of deposition blocking material with substantially reduced or substantially eliminated pin-holing when compared to SAM formed blocking masks. Typically, the parylene deposition blocking masks described can be deposited with significantly reduced processing time and temperatures, e.g., less than about 20 minutes to deposit a layer having a thickness of about 200 Å at a substrate maintained at less than about 30° C., when compared to the typically hours long processes required to form a SAM often conducted at temperatures exceeding 100° C. Further, the pure carbon and hydrogen parylene mask material is relatively easier to remove from the substrate using conventional dry etching methods, such as a dry plasma etch, when compared to the removal of residual SAM material which may require costly and time consuming emersion and ultra-sonication of the substrate in a suitable organic solvent.

While the foregoing is directed to embodiments of the present disclosure, other and further embodiments of the disclosure may be devised without departing from the basic scope thereof, and the scope thereof is determined by the claims that follow.

The invention claimed is:

1. A method of selectivity depositing a mask layer on a patterned surface of a substrate, comprising:
    positioning the substrate on a substrate support in a processing volume of a processing chamber, wherein the patterned surface of the substrate comprises a dielectric layer and a plurality of first metal features disposed in the dielectric layer;
    exposing the patterned surface to a parylene monomer gas;
    selectively depositing a first layer comprising parylene onto surfaces of the dielectric layer; and
    depositing a second layer onto the plurality of first metal features.

2. The method of claim 1, wherein exposing the patterned surface to the parylene monomer gas comprising flowing the parylene monomer gas into the processing volume while rotating the substrate disposed therein.

3. The method of claim 1, wherein the parylene monomer gas comprises a pyrolysis reaction product of a vapor-phase parylene dimer.

4. The method of claim 1, wherein the first layer comprises parylene N, parylene D, parylene C, parylene HT, or combinations thereof.

5. The method of claim 1, wherein the plurality of first metal features comprise a parylene deposition inhibitor metal selected from the group consisting of Ta, Fe, Ru, W, Co, Ni, Pd, Pt, Cu, Ag, Mo, Au, and combinations thereof.

6. The method of claim 1, wherein the dielectric layer comprises Si, $SiO_2$, $SiN_xO_y$, SiN, SiOC, SiC, one or more Si low-k polymers, one or more high-K dielectric materials, or combinations thereof.

7. The method of claim 1, wherein the dielectric layer comprises one or a combination of oxides, oxynitrides, or silicon nitrides of aluminum (Al), hafnium (Hf), lanthanum (La), or zirconium (Zr).

8. The method of claim 1, wherein the dielectric layer comprises one or a combination of hafnium (Hf) based oxides, oxynitrides, or silicon nitrides.

9. The method of claim 8, wherein the second layer comprises metal, and wherein depositing the second layer forms a plurality of second metal features disposed on the plurality of first metal features.

10. The method of claim 9, wherein the plurality of second metal features are substantially aligned with the plurality of first metal features at interfacial surfaces thereof.

11. The method of claim 9, wherein the plurality of second metal features are substantially centered on surfaces of the plurality of first metal features disposed therebeneath.

12. The method of claim 8, wherein the second layer comprises a dielectric material, and wherein depositing the second layer forms a plurality of dielectric features disposed on the plurality of first metal features.

13. The method of claim 12, wherein the plurality of dielectric features are substantially aligned with the plurality of first metal features at interfacial surfaces thereof.

14. The method of claim 12, wherein the plurality of dielectric features are substantially centered on surfaces of the plurality of first metal features disposed therebeneath.

15. A method of selectivity depositing a mask layer on a surface of a patterned substrate, comprising:
- positioning the patterned substrate on a substrate support in a processing volume of a processing chamber; wherein the surface of the patterned substrate includes a dielectric layer and a plurality of first metal features disposed in the dielectric layer, wherein the plurality of first metal features comprise a parylene deposition inhibitor metal selected from the group consisting of Ta, Fe, Ru, W, Co, Ni, Pd, Pt, Cu, Ag, Au, Mo, and combinations thereof;
- flowing a parylene monomer gas into the processing volume while rotating the patterned substrate disposed therein;
- exposing the surface of the patterned substrate to the parylene monomer gas;
- forming a first layer on the patterned substrate, wherein the first layer comprises a patterned parylene layer, and wherein forming the patterned parylene layer comprises selectively depositing a plurality of parylene features on dielectric surfaces of the dielectric layer; and
- depositing a second layer on the first layer.

16. The method of claim 15, wherein the dielectric layer comprises Si, $SiO_2$, $SiN_xO_y$, SiN, SiOC, SiC, one or more high-K dielectric materials, or combinations thereof.

17. The method of claim 15, wherein the patterned parylene layer comprises parylene N, parylene D, parylene C, parylene HT, or combinations thereof.

18. The method of claim 15, wherein the second layer comprises metal, and wherein depositing the second layer forms a plurality of second metal features disposed on the plurality of first metal features.

19. A method of forming a self-aligned patterned mask, comprising:
- depositing a parylene layer directly onto a surface of a patterned substrate, wherein the parylene layer comprises a plurality of parylene features and a plurality of openings, wherein the patterned substrate comprises a dielectric layer and a plurality of metal features, wherein the plurality of metal features comprise a parylene deposition inhibitor metal, and wherein depositing the parylene layer selectively forms the plurality of parylene features directly on dielectric surfaces of the dielectric layer.

20. The method of claim 19, wherein the parylene layer comprises parylene N.

* * * * *